United States Patent [19]

Liaw et al.

[11] 4,200,621

[45] Apr. 29, 1980

[54] SEQUENTIAL PURIFICATION AND CRYSTAL GROWTH

[75] Inventors: H. Ming Liaw; Charles J. Varker, both of Scottsdale, Ariz.

[73] Assignee: Motorola, Inc., Schaumburg, Ill.

[21] Appl. No.: 925,733

[22] Filed: Jul. 18, 1978

[51] Int. Cl.$^2$ .............................................. C01B 33/02
[52] U.S. Cl. .................................... 423/348; 423/350; 156/617 SP; 156/64
[58] Field of Search ............................. 423/348, 350; 156/617 SP, DIG. 64, 624; 75/93

[56] References Cited

U.S. PATENT DOCUMENTS

| | | | |
|---|---|---|---|
| 2,866,701 | 12/1958 | Strauss | 423/348 |
| 3,012,865 | 12/1961 | Pellin | 423/348 X |
| 4,124,410 | 11/1978 | Kotval et al. | 156/617 SP |

FOREIGN PATENT DOCUMENTS 922879 4/1963 United Kingdom ...................... 423/348

*Primary Examiner*—G. O. Peters
*Attorney, Agent, or Firm*—John A. Fisher

[57] ABSTRACT

A combined method for purifying silicon and growing single crystals. A multiple step process is disclosed by which metallurgical grade silicon is purified and converted into a high quality monocrystalline silicon ingot. Each of the steps in the process is designed to remove specific impurities and thus improve the electrical quality of the silicon material. First, the insoluble slag and high segregation coefficient impurities are removed. Soluble impurities are then removed by a reactive gas step, and by a liquid-liquid extraction step using reactive metallic oxides or an oxide solvent. The remaining impurities are removed by segregation during freezing by pulling an ingot from a portion of the molten metallurgical grade silicon. The ingot so formed is then used to charge a second crystal puller. One or more of the previous purifying steps can then be repeated for the charge of the second crystal puller and an ingot of improved purity can be pulled from the melt of the second puller. In like manner, third and successive reiterations of the process can be used to obtain silicon of the desired purity and crystal quality.

14 Claims, 5 Drawing Figures

SEQUENTIAL PURIFICATION AND CRYSTAL GROWTH

BACKGROUND OF THE INVENTION

This invention relates to a method for purifying silicon, and more particularly to a method whereby metallurgical grade silicon can be sequentially purified and the purified silicon used to produce a high quality monocrystalline silicon ingot.

The semiconductor industry uses large and ever increasing quantities of high quality monocrystalline silicon. This is especially true with the growing interest in silicon solar cells and with the large volume of silicon that these cells require. This material must be of high crystalline quality, low in impurity content, and of a prescribed resistivity. Such material is often described by the term "semiconductor grade" silicon. To make the solar cells a competitive source for power generation, there must be a significant reduction in the price of this semiconductor grade silicon.

Metallurgical grade silicon is an impure form of silicon formed by the arc reduction of silica sand. It is electrically similar to a poor conductor rather than to a good semiconductor. The metallurgical grade silicon contains about one to two percent impurities including iron, aluminum, calcium, chromium, manganese, nickel, titanium, and vanadium. It also contains small quantities of boron, phosphorus, and other impurities. Most high quality silicon is produced today by converting the metallurgical grade silicon into liquid and gaseous halosilanes which can be purified, for example, by distillation. The purified halosilanes can be reduced with hydrogen to deposit pure polycrystalline silicon on a heated filament. This pure polycrystalline silicon is then used to charge a crystal puller and a monocrystalline ingot is pulled by the Czochralski technique. Such a process is expensive and is not likely to lead to low enough costs to be feasible for solar cells in large scale applications.

Accordingly, it is an object of this invention to provide an improved process for the purification of silicon.

It is a further object of this invention to provide a process for the purification of metallurgical grade silicon and for the conversion of that purified silicon into monocrystalline silicon ingots.

It is another object of this invention to provide a process whereby impure silicon can be purified and converted into semiconductor grade monocrystalline silicon.

It is a still further object of this invention to provide a low cost, continuous process for converting impure silicon to pure and dislocation-free single crystalline silicon.

SUMMARY OF THE INVENTION

In one embodiment of this invention the crucible of a crystal puller is charged with metallurgical grade silicon. The impure silicon is melted and insoluble impurities floating on the surface of the melt are removed. Then, depending upon the desired purity of the resultant silicon, a number of additional processing and purifying steps can be applied. Reactive gases can be bubbled through the molten silicon to form compounds with certain of the soluble impurities dissolved in the silicon melt. Calcium carbonate or other metallic oxide or oxide-slag forming materials can be added to the melt to preferentially extract certain impurities from the melt. Further purification results from dipping a seed crystal into the melt and pulling an ingot. In this manner, crystallization produces an ingot which is lower in impurity content than the melt remaining in the crucible. This ingot can then be used to charge a second crystal puller and such purifying steps as are necessary are repeated for the charge of this second crystal puller. A second crystalline ingot is obtained from the second crucible. The process can be terminated at this point, or the ingot can be further purified by using it as the charge for a subsequent growth cycle.

BRIEF DESCRIPTION OF THE DRAWINGS

Other objects and advantages of the invention will become apparent upon reading the following detailed description taken in connection with the drawings, in which.

DETAILED DESCRIPTION OF THE INVENTION

Figure 1:
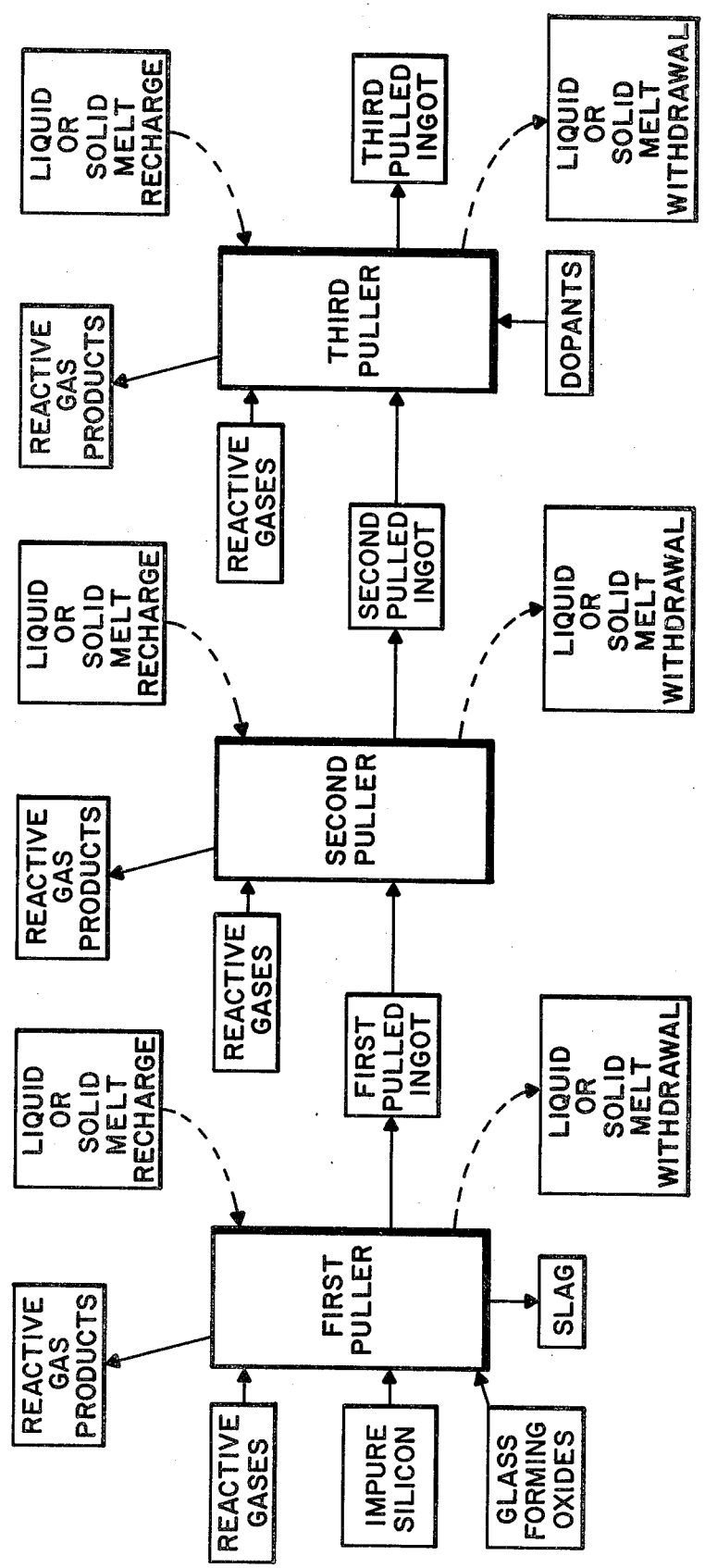
FIG. 1 is a material flow chart for the process.

In accordance with the invention, metallurgical grade silicon is purified without resorting to the conventional halosilane purification process. The impure metallurgical grade silicon is purified by a series of discrete purification steps. Each of the steps is relatively independent of the other steps and each contributes to the purification process. The degree of purification required or desired for the end product determines the number of processing steps employed. An overview of the interrelationship between the various process steps is shown in the material flow chart of FIG. 1. The first puller is charged with impure metallurgical grade silicon. To this charge are added reactive gases and glass forming oxides. Reactive gas products, slag, and insoluble impurities are removed from the melt. An ingot of improved purity can then be pulled from the melt. This ingot can then be used to charge a second puller. Again, reactive gases can be added to the melt to remove impurities as reactive gas products. A second ingot of improved purity and crystal quality is then pulled from this melt and is used to charge a third puller. The process can be continued through any number of such successive steps to attain the desired crystal purity and perfection. Flexibility of the process is enhanced by providing for melt withdrawal and recharge, in either liquid or solid form, for each of the pullers.

Figure 2:
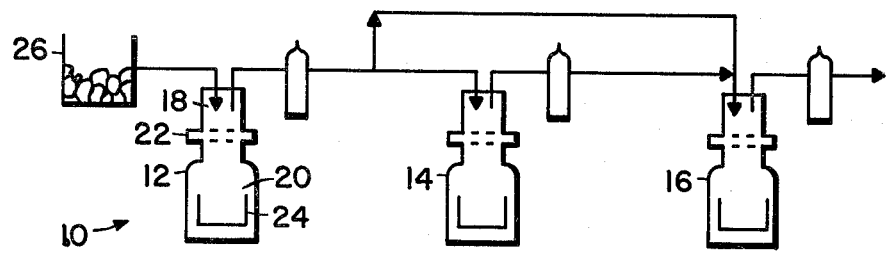
FIG. 2 schematically shows an arrangement of an apparatus for practice of the invention.

The purification process is accomplished in an apparatus 10 as shown schematically in FIG. 2. The apparatus 10, in this embodiment, is comprised of three substantially identical crystal pullers 12, 14, 16. The first crystal puller 12 has an upper chamber 18 and a lower chamber 20 which can be partitioned by a moveable gate valve 22. A refractory crucible 24 with a carbon heater element (not shown) is positioned within the lower chamber 20. The particular type of heater used is not important to the invention. This crucible 24 is filled or charged with metallurgical grade silicon 26. The charge 26 would typically be about 7 kilograms, but the amount of silicon used can be varied to suit a particular crucible size and to accommodate the size of the desired ingot. After the crucible 24 has been filled with a metallurgical grade silicon charge the crystal puller can be sealed, evacuated, and backfilled with an inert ambient.

Figure 3:
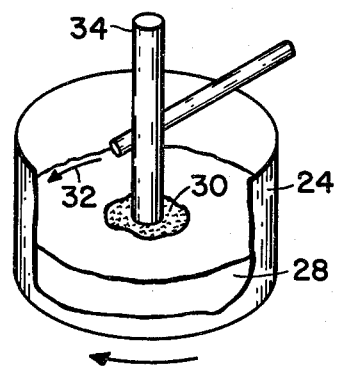
FIGS. 3 and 4 depict methods for removing impurities from the melt in accordance with the invention.

FIG. 3 shows the crucible 24 and the first of the purifying steps. The crucible 24 is charged with metallurgical grade silicon. This charge is heated to form a melt 28 or molten mass of metallurgical grade silicon. Insoluble impurities or slag 30 floats on the surface of the melt. The insoluble slag must be removed before a crystalline ingot can be pulled from the melt since parts of the slag would deposit on the forming crystal. The residual slag can act as nucleation sites for the freezing silicon and severely impede the ingot growth. In normal operation of the crystal puller the crucible is rotated to provide a stirring of the melt and to reduce thermal gradients within the melt. The slag 30 floating on the melt 28 can be manipulated to coalesce at the center of the crucible by directing a gas flow 32 onto the crucible wall with the crucible in rotation. A gas flow of about ten cubic feet per hour through a three-eights inch quartz tube has been found to be effective. By adjusting the crucible rotation rate to about 10 rotations per minute, the slag is kept away from the crucible wall and collects at the center of the melt as indicated in FIG. 3. Once the slag has coalesced at the center of the melt, the temperature is reduced by 10° C.-15° C. to supercool the melt. A crystalline seed 34 can then be dipped through the slag 30 to contact the melt 28 beneath the slag. The cooled silicon melt starts to freeze on the seed 34. As a small portion of the melt solidifies to the seed, the majority of the slag is trapped within and on top of the solidifying melt. After the slag 30 has been trapped by this portion of freezing melt, the quick withdrawal of the seed removes the slag from the melt. Dissolved impurities within the melt which have segregation coefficients greater than one would also be removed by this purification step. The segregation coefficient of an impurity is the ratio of the solubility of the impurity in the solid phase to the solubility in the liquid phase, so impurities for which the coefficient is greater than one preferentially segregate to the solid. The seed crystal 34 with the portion of solidified melt and the undesired slag attached to it can be raised into the upper chamber 18 of the crystal puller 12 and the gate valve 22 closed to seal off the bottom chamber 20. The upper chamber 18 can then be opened and the slag removed by separating it from the seed. The use of the two chamber crystal puller is necessary so that the proper ambient can be maintained in proximity to the melt 28 while the upper chamber 18 is being vented to the air.

Figure 4:
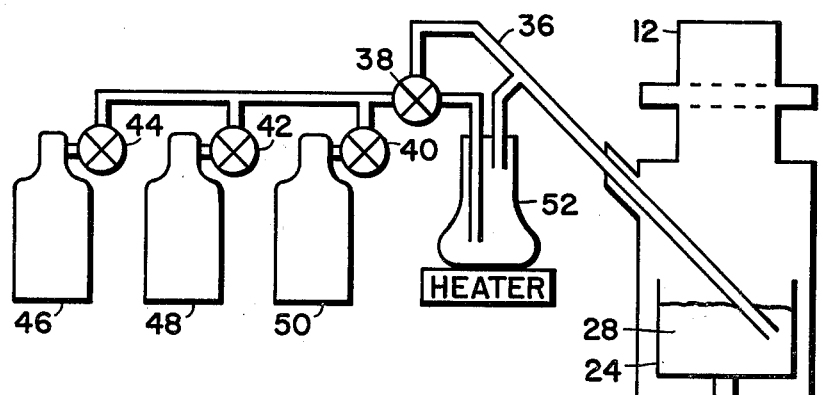

FIG. 4 schematically shows a second purification step which can be used to remove soluble impurities from the metallurgical grade silicon. The crystal puller 12 is adapted to permit the treatment of the melt 28 with reactive gases. One end of a quartz tube 36 is dipped into the silicon melt 28, while the other end is connected by means of a set of valves 38, 40, 42, 44 to sources 46, 48, 50 of various reactive gases. Reactive gases are those gases chosen to preferentially form compounds with impurities contained in the metallurgical grade silicon melt. Reactive gases which have been found advantageous in this purification step are chlorine, wet hydrogen, oxygen, and hydrogen chloride. The bubbling of chlorine through the silicon melt, for example, forms volatile aluminum trichloride which is removed from the melt because of its volatile nature. This reaction can be used for the removal of aluminum from the melt because the free energy of formation favors the formation of the aluminum trichloride ($-132$ KCal/mole) over the formation of silicon tetrachloride ($-88$ KCal/mole). Wet hydrogen bubbled through the silicon melt reacts with dissolved oxygen to form water vapor. To a lesser extent the wet hydrogen also reacts with dissolved boron to form hydrides which are also very volatile at the melting temperature of silicon (1412° C.). Although pure reactive gases can be used, in practice they are usually diluted with an inert gas such as argon to about 5 percent. The wet hydrogen is obtained by bubbling hydrogen through a water bath 52 prior to bubbling into the melt. The partial pressure of the water in hydrogen is controlled by the temperature of the water bath 52. The sequential bubbling of the various reactive gases is accomplished by the manipulation of the valves 38, 40, 42, 44. One or more of the reactive gases can be used depending upon the impurities to be removed. For example, the sequential bubbling of 10 cubic centimeters of each of 5 percent chlorine and 5 percent wet hydrogen reduces the concentrations of chromium, titanium and aluminum in the melt to one third of their initial values.

In a third and further purification step metallic oxide or oxide-slag forming compounds such as calcium carbonate ($CaCO_3$), barium oxide (BaO) and magnesium oxide (MgO) are added to the melt either alone or in combination. Added to the melt in an amount from 1 to 5 percent of the silicon charge, these oxides react with the silicon dioxide of the quartz crucible to form a eutectic glass. The eutectic glass can dissolve and thus extract certain impurities from the melt. Bubbling an inert gas through the melt provides a stirring of the melt and accelerates the rate of extraction. The eutectic glass with the dissolved impurities adheres to the crucible wall. The melt surface thus remains clean and an ingot can be pulled from the melt. As an example, the amount of impurity aluminum in the silicon is reduced by about one order of magnitude by adding one percent calcium carbonate to the melt.

Figure 5:
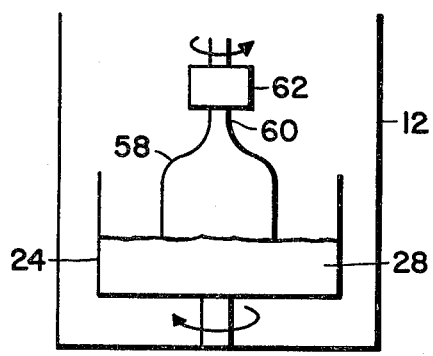
FIG. 5 shows the pulling of an ingot from the melt.

The remaining metallic impurities in the silicon melt are removed by pulling a crystalline ingot from the melt as shown in FIG. 5. Most of the metallic impurities have segregation coefficients between $10^{-5}$ and $10^{-7}$. Thus by pulling a solid ingot 58 from the melt 28 the concentration of these low segregation coefficient impurities in the solid body is reduced by 5 to 7 orders of magnitude in comparison with the impurities left in the remaining melt. The notable exceptions for which this purification step is relatively inefficient are boron and phosphorus which have segregation coefficients of approximately 0.8 and 0.35 respectively. While some boron and phosphorus are removed by pulling the solid ingot 58, the aforementioned purification steps must be relied upon for the removal of most of these two elements. The solid ingot 58 is pulled from the melt 28 in a manner similar to that used for the conventional Czochralski growth process. In this process a monocrystalline seed 60 which is held by a seed holder 62 is dipped into the melt 28 of metallurgical grade silicon. The seed 60 and holder 62 are typically rotating at about 15 to 20 revolutions per minute in a direction opposite to the direction of rotation of the crucible 24. The seed 60 is slowly withdrawn from the melt 28 at a rate of 3 to 4 inches per hour, pulling the solid body 58 from the melt. The ingot 58 pulled from the melt is referred to as the first-pulled ingot. The first-pulled ingot is generally not a single crystal, but rather is polycrystalline in nature. About half the melt 28 is used for this first-pulled ingot and the remaining melt is recharged with metallurgical grade silicon. The multiple steps of purification are repeated for this recharged melt. This first-pulled ingot 58, now purified of most impurities by 5 to 7 orders of magnitude, is used as feedstock for the second puller 14 (FIG. 2). The second puller 14 can be used for either an additional purification cycle or as a final crystal growth cycle. As a second purification cycle, the procedures as described above for the first puller 12 are repeated except that there is no slag formation on this melt so the phase separation step is no longer necessary. The ingot pulled from the second puller 14 (second-pulled ingot) contains metallic impurities at a concentration of 10 or more orders of magnitude lower than the concentration in the original metallurgical grade silicon 26. When additional purification is not needed, the second puller 14 can be used directly to produce the final single crystal ingot. In this case a desired amount of dopant is added to the puller 14 when charging that puller with the first-pulled ingot. If additional purification or crystal perfection is needed, the second-pulled ingot is used to charge the third puller 16. Then the desired dopants are added to the third puller along with the second pulled ingot. With each subsequent pulling, both the crystallity and purity of the ingot improve. Alternatively, float zone refining can be substituted for one or more of the final crystal pulling operations.

The apparatus 10 has been described with respect to three substantially identical pullers 12, 14, 16. The process can be carried out, of course, using either more or fewer pullers. The process can, in fact, be carried out using a single crystal puller, although some of the benefits of a continuous system are then sacrificed. After an ingot or crystal is formed and withdrawn from the melt, the crucible can be emptied by draining off the remaining liquid or by freezing the silicon and removing the melt as a solid. This is then followed by recharging the same crucible with the previously pulled ingot. Maximum utilization of available crystal pullers may require a combination of serial and parallel operations requiring interim melt recharging and emptying in a single puller in time sequence with multiple puller operation. Using a multiple puller system with each puller having two separable chambers, as illustrated, permits a highly efficient, continuous system. The two separable chambers permit the opening of the puller to the atmosphere while the puller crucible holds a heated charge. This allows either recharging or removal of slag or ingots without cooling the system. Thus, for example, after an ingot has been pulled from the first puller, that ingot can be transferred to the second puller and the first puller can be recharged to again fill its crucible. The wasted time and energy for heating up and cooling down is thus eliminated or, at least, significantly reduced.

By practice of the method of this invention, the conventional preparation steps for the use of a semiconductor grade chemical vapor deposited polycrystalline silicon charge prior to a standard Czochralski crystal pulling are completely eliminated. These steps include the cutting of the polycrystalline rods to the proper size and the etching and cleaning of the cut sections. The direct use of metallurgical grade silicon in a conventional pulling operation is not possible because the impurities in metallurgical grade silicon preclude the pulling of a monocrystalline ingot. Also, since the single crystal seed attached to each pulled ingot carries that ingot from one ingot to the next, the use of a recharging tool is eliminated.

The following non-limiting examples represent best modes contemplated for the practice of the invention and serve to further explain the invention.

Typically the first purification step separates the floating slag from the molten silicon. Table I compares the concentrations of calcium and iron in the input metallurgical grade silicon, the removed slag, and the first pulled ingot. The concentrations are analyzed by emission spectroscopy and represent typical values. These results show that the first purification step is effective for the reduction of calcium and iron concentrations.

TABLE I

Concentration of Iron and Calcium in Input Metallurgical Grade Silicon, Removed Slag, and First Pulled Ingot (ppm)

|  | Input Metallurgical Grade Silicon | Removed Slag | First Pulled Ingot |
|---|---|---|---|
| Iron | >1000 | >>1000 | 10–500 |
| Calcium | 8 | >500 | 1 |

Following the removal of the floating slag, the melt is treated with reactive gases. Sequentially bubbling 10 cubic centimeters each of wet hydrogen and chlorine (each diluted to 5 percent) through the melt results in the reduction in the concentration of iron, manganese, chromium, vanadium and aluminum. Table II compares the concentrations of these impurities in the melt with and without reactive gas treatment. In general, a one-third reduction in these impurities is observed.

TABLE II

Impurity Concentration in Reactive Gas Treated and Untreated Melt (ppm)

|  | Untreated Melt | Treated Melt |
|---|---|---|
| Iron | >1000 | 1000 |
| Manganese | 300 | 100 |
| Chromium | 100 | 30 |
| Vanadium | 100 | 30 |
| Aluminum | 30 | 10 |

Further purification results from the use of metallic oxides. One percent calcium carbonate is added to the melt. At the elevated temperature of molten silicon, the calcium carbonate decomposes to form calcium oxide (CaO). The calcium oxide first reacts with the quartz crucible to form $CaO-SiO_2$ bioxides which then act to extract impurities from the melt. Table III compares the concentrations of impurities within the melt and bonded to the $CaO-SiO_2$ oxide phase. The mixed oxide is most effective in reducing the concentration of aluminum, calcium, magnesium and strontium in the melt.

TABLE III

Distribution of Impurities Between Molten Silicon and $CaO-SiO_2$ Phase (ppm)

|  | Silicon Melt | $CaO-SiO_2$ Phase |
|---|---|---|
| Calcium | 33 | >1000 |
| Strontium | <1 | 330 |
| Magnesium | <1 | 100 |
| Aluminum | 100 | >1000 |

A number of sequential ingot pulls reduces the concentration of those impurities having segregation coefficients less than one. Table IV illustrates the variation in concentrations of aluminum, iron and phosphorus as a function of number of pulls. The concentration of impurities decreases with each successive pull, but questions of economics may limit the number of pulls utilized in any particular circumstance. Second and third pulled ingots are typically single crystals and in most cases are free of dislocations. The most efficient segregation or partitioning of impurities occurs when transforming from a liquid to a single crystal.

TABLE IV

| Variation of Impurity Concentration With Number of Ingot Pulls (ppm) | | | |
|---|---|---|---|
|  | First Pull | Second Pull | Third Pull |
| Aluminum | 10–20 | 7–8 | 0.01–0.03 |
| Iron | 0.1–100 | 0.09–0.3 | 0.09–0.2 |
| Phosphorus | 0.7–2 | 0.4–1 | 0.1–0.7 |

Thus it is apparent that there has been provided, in accordance with the invention, a method for sequential purification and crystal growth that fully satisfies the objects set forth above. While the invention has been described in conjunction with specific embodiments, it is evident that many alternatives and variations will be apparent to those skilled in the art in light of the foregoing description. In particular, the method has been described in terms of a succession of process steps, but changing the order of those steps will not alter the result of the method. Further, the invention has been described in conjunction with a particular apparatus, but the invention is not intended to be so limited. Accordingly, it is intended to embrace all such alternatives and variations as fall within the scope of the following claims.

What is claimed is:

1. A process for the sequential purification and crystal growth of silicon crystals from impure silicon which comprises the steps of: melting said impure silicon in a crucible to form a melt; removing insoluble impurities from said melt by rotating said crucible and said melt and directing a gas flow onto a wall of said crucible, said rotating and said gas flow causing said insoluble impurities to coalesce on said melt, inserting a seed through said insoluble impurities to contact said melt, freezing a portion of said melt to said seed to trap said insoluble impurities, and withdrawing said seed, frozen melt and insoluble impurities; reacting a gas with said melt to remove soluble impurities from said melt; adding an oxide-slag forming compound to said melt to further remove soluble impurities; inserting a seed crystal into said melt and pulling an ingot from a portion of said melt; remelting said ingot to form a second melt; inserting a seed into said second melt and pulling a crystal therefrom.

2. The process of claim 1 wherein said gas comprises a gas or a sequence of gases selected from the group consisting of wet hydrogen, chlorine, oxygen, and hydrogen chloride.

3. The process of claim 1 wherein said oxide-slag forming compound comprises a compound selected from the group consisting of calcium carbonate, barium oxide and magnesium oxide taken alone or mixtures thereof.

4. The process of claim 1 further comprising the reacting of said second melt with reactive gas to further remove soluble impurities.

5. The process of claim 4 further comprising: melting said crystal to form a third melt; adding a dopant to said third melt; and pulling a crystal therefrom.

6. A method for removing insoluble slag from the surface of a silicon melt contained in a crucible which comprises the steps of: rotating said crucible and said melt; directing a flow of gas onto a wall of said crucible; adjusting said rotating and said flow to cause said insoluble slag to coalesce at a location on said surface; inserting a seed crystal through said coalesced insoluble slag to contact said melt; cooling said melt to cause a portion of said melt to freeze to said seed, trapping said insoluble slag; and withdrawing said seed, said frozen melt and said insoluble slag.

7. A process for sequential purification and silicon crystal growth from an impure silicon charge which comprises the steps of: heating said impure silicon charge in a crucible to form a melt; manipulating insoluble impurities floating on said melt to coalesce said impurities; freezing a portion of said melt to trap said impurities; removing said frozen portion and said trapped impurities; removing soluble impurities dissolved in said melt; pulling a first ingot from a portion of said melt; charging a second crucible with said first ingot; heating said first ingot to form a second melt in said second crucible; and pulling a crystal from said second melt.

8. The process of claim 7 wherein said impure silicon charge comprises metallurgical grade silicon.

9. The process of claim 8 wherein said step of removing soluble impurities comprises adding an oxide-slag forming compound to said melt.

10. The process of claim 9 wherein said compound comprises calcium carbonate.

11. The process of claim 7 further comprising the adding of dopant materials to said second melt to dope said crystal.

12. A method for purifying metallurgical grade silicon which comprises: melting said metallurgical grade silicon to form a first melt, said first melt containing insoluble and soluble impurities present in said metallurgical grade silicon; manipulating insoluble impurities floating on said melt to coalesce said impurities; freezing a portion of said melt to trap said impurities; removing said frozen portion and said trapped impurities; adding oxide-slag forming compounds to said first melt to remove soluble impurities; pulling a first ingot from a portion of said first melt; heating said first ingot to form a second melt, said second melt having less impurities than said first melt; reacting gas with said second melt to remove soluble impurities therefrom; pulling a second ingot from a portion of said second melt; heating said second ingot to form a third melt; pulling a third ingot from said third melt, said third ingot being substantially free of said impurities present in said metallurgical grade silicon.

13. The method of claim 12 further comprising the step of adding dopant material to said third melt to dope said third ingot.

14. The method of claim 12 further comprising the step of reacting gas with said first melt to remove soluble impurities therefrom.

* * * * *